United States Patent [19]

Taylor

[11] Patent Number: 5,202,896

[45] Date of Patent: Apr. 13, 1993

[54] BIPOLAR INVERSION CHANNEL FIELD EFFECT TRANSISTOR LASER

[75] Inventor: Geofrey W. Taylor, Holmdel, N.J.

[73] Assignee: The United States of America as represented by the Secretary of the Air Force, Washington, D.C.

[21] Appl. No.: 730,759

[22] Filed: Jul. 16, 1991

[51] Int. Cl.[5] .............................................. H01S 3/19
[52] U.S. Cl. .................................. 372/50; 372/45; 372/46; 257/12; 257/79
[58] Field of Search .............. 372/50, 45, 46; 357/17, 357/16

[56] References Cited

U.S. PATENT DOCUMENTS

| | | | |
|---|---|---|---|
| 4,766,472 | 8/1988 | Brillouet et al. | 372/50 |
| 4,819,036 | 4/1989 | Kuroda et al. | 357/4 |
| 4,826,784 | 5/1989 | Salerno et al. | 437/89 |
| 4,888,624 | 12/1989 | Johnston, Jr. et al. | 357/16 |
| 5,003,359 | 3/1991 | Abeles | 372/50 |

FOREIGN PATENT DOCUMENTS

| | | | |
|---|---|---|---|
| 0021887 | 2/1983 | Japan | 372/50 |
| 0056489 | 4/1983 | Japan | 372/50 |
| 0256783 | 11/1986 | Japan | 372/50 |

*Primary Examiner*—Georgia Y. Epps
*Attorney, Agent, or Firm*—Robert L. Nathans; Donald J. Singer

[57] ABSTRACT

A new type of laser structure utilizes field-effect at a self-aligned p-n junction to control the current flow into the active quantum well region. The HFET laser structure is identical to the corresponding HFET transistor and is realizable with the same fabrication technology. The optical properties of the laser are optimized simultaneously with the electrical properties of the FET and thus the prospect of opto-electronic integration of the laser and the transistor are excellent.

24 Claims, 3 Drawing Sheets

BIPOLAR INVERSION CHANNEL FIELD EFFECT TRANSISTOR LASER

STATEMENT OF GOVERNMENT INTEREST

The invention described herein may be manufactured and used by or for the Government for governmental purposes without the payment of any royalty thereon.

BACKGROUND OF THE INVENTION

Integration of the semiconductor laser and the transistor is a very important step in the realization of optoelectronic integrated circuits. This combination would be a key building block for optical data communications and information processing systems. The monolithic integration of a field effect transistor (FET) with a laser would be very attractive because of the potential for high speed, high density, reliability and low cost (Wada, T. Sakurai, and T. Nakagami, IEEE J. Quantum Electron, QE-22,805, 1986). This integration has been difficult until now because of the inherent differences in growth structure and operation of these two devices (S. R. Forrest, Proc. IEEE, Vol. 75, No. 11, pp 1488-1498). In lasers the optical guiding and confinement layers usually dictate a vertical device thickness of 2-3 microns with current flow in the vertical direction. However in FETS the current flow is confined to a narrow channel in the plane of the layers. Traditionally in III-V FET's the device thicknesses must be small in the vertical direction because the gate electrode must be in close proximity to the channel in order to increase the field effect. Hence, FET structures such as the HEMT or SISFET have metal electrodes within about 300-500 A from the conducting interface. A further difficulty lies in the fabrication technologies since the isolation and passivation technologies for the two are inherently different.

Previously we had introduced a new type of field effect transistor (HFET-Heterostructure Field-Effect Transistor) which utilized inversion at a heterointerface produced by a novel planar doping structure (G. W. Taylor and J. G. Simmons, Electronics Letters, Jul. 17, 1986, Vol. 22, No. 15, pp. 784-786; G. W. Taylor, M. S. Lebby, T. Y. Chang, R. N. Gnail, N. Sauer, B. Tell and J. G. Simmons, Electronics Letters, Jan. 16, 1987, Vol. 23, No. 2, pp. 77-79). It was indicated that this FET was ideal for integration with lasers (G. W. Taylor, D. L. Crawford, P. A. Kiely, S. K. Sargood, P. Cooke, A. Izabelle, T. Y. Chang, B. Tell, M. S. Lebby, K. Brown-Boebeler and J. G. Simmon, IEEE Transactions on Electron Devices, Vol. 35, No. 12, pp. 2466; G. W. Taylor, D. L. crawford, P. A. Kiely, P. Cooke, S. Sargood, A. Izabelle, T. Y. Chang, B. Tell, M. S. Lebby, K. Brown-Goebeler and J. G. Simmons, Proc. SPIE, Vol. 994, pp. 251-257) and other optical devices based on the same concept because it introduced an ohmic contact for the gate on a highly p-doped layer. The gate contact is separated by at least 1 micron of neutral material from the active channel (the gate barrier is provided by the built-in depletion region) in contrast to the HEMT, the MESFET and the SISFET where the gate barrier is a schottky close to the interface. The larger gate barrier in the HFET provides for enhanced supply voltages and circuit noise margins. It also was fabricated with a substantial p doping and wide bandgap material below the heterointerface to provide the formation of a natural graded index structure. In the versions of the HFET that have been reported it was fabricated with a self-aligned refractory technology which is ideally suited for a high yield and high density technology (G. W. Taylor, P. A. Kiely, A. Izabelle, D. L. Crawford, M. S. Lebby, T. Y. Chang, B. Tell, K. Brown-Goebeler and J. G. Simmons, IEEE Electron Device Letters, Vol. 10, No. 2, February, 1989; R. S. Mand, S. Eicher and A. J. Springthorpe, Electronics Letter, Vol. 25, March, 1989, pp. 386-387).

BRIEF SUMMARY OF A PREFERRED EMBODIMENT OF THE INVENTION

The laser of the present invention has a p-n-p structure, with the active layer being a quantum well body and the n region being a very thin, highly doped layer. The laser cavity obtains confinement in the vertical direction from the higher index of refraction material in the upper and lower cladding; and the lateral confinement is provided by two ion-implanted n+ wells which have been self aligned to the gate contact. Lasing is achieved by foward biasing both junctions. Thus holes are pumped into the active region from both the emitter and collector contacts. The electrons are pumped into the active region laterally and symmetrically through the two n+ wells on either side of the active region. The HFET may operate as a graded index separate confinement heterostructure quantum well (GRIN QW) laser. The requirements of the HFET and the HFET laser are mutually compatible and thus optimization of both can be achieved simultaneously. Therefore monolithic integration of the laser and the FET are assured.

DETAILED DESCRIPTION

Figure 1:
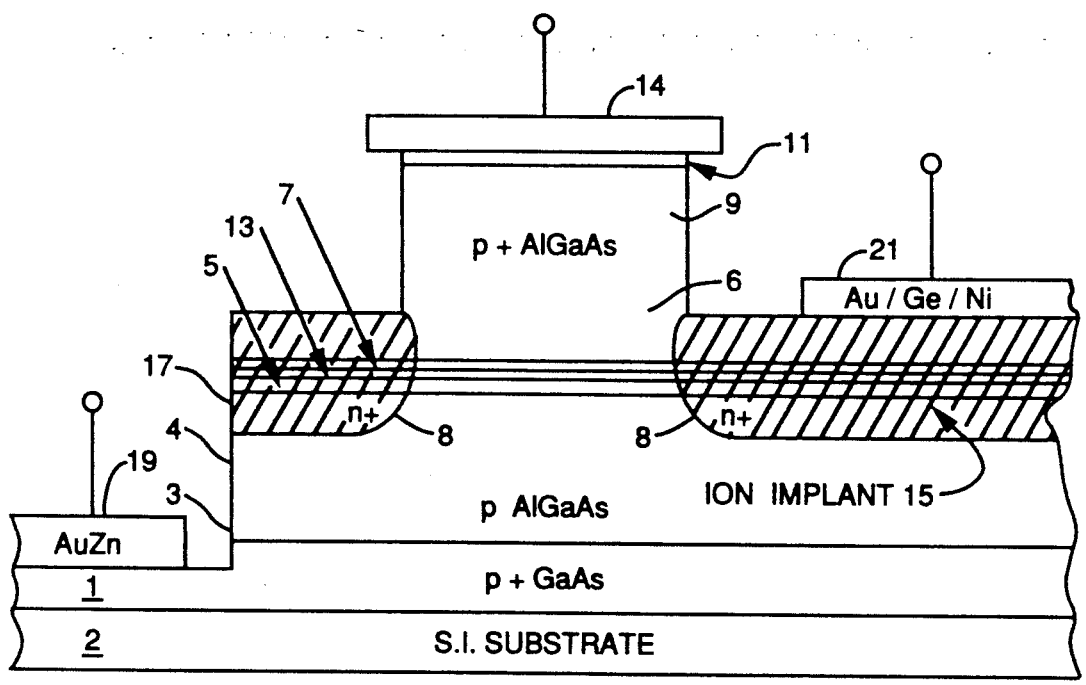
FIG. 1 shows cross-section of the HFET laser as fabricated by the self-aligned refractory gate technology.

As shown in FIG. 1, the HFET was grown on a semi-insulating (S.I.) GaAs substrate by molecular beam epitaxy (MBE). The layer sequence consisted of 6000 A of pt ($1 \times 10^{18}$ cm$^{-3}$) GaAs for the collector contact layer 1, positioned on Si substrate 2. 6000 A of p($5 \times 10^{17}$ cm$^{-3}$) AL.4GaAs is grown for the lower cladding 3; 2000 A of p(undoped) AlGaAs graded to GaAs is provided at 4; 75 A of undoped GaAs forms the laser active FET channel region 5 preferably having three quantum wells therein, 20 A of undoped Al.2-5GaAs, and 80 A of n+ ($5 \times 10^{18}$ cm$^{-3}$) Al.25GaAs are provided to form the charge sheet 7; 2000 A of p ($5 \times 10$ cm$^{-3}$) AlGaAs graded from 25% to 40% Al content are grown at portion 6; 1 micron of pt ($5 \times 10^{17}$ cm$^{-3}$) Al.4GaAs to forms the upper cladding layer 9; and 400 A of p ($5 \times 10^{19}$ cm$^{-3}$) GaAs forms the ohmic contact region 11. The growth temperature and growth rate for the GaAs was 700 degrees C. and 1.2 microns/hr. The spacer layer 13 of 20 A serves to enhance the mobility of the undoped quantum well by moving the ionized donor centers away from the interface but is kept to a minimum to maximize the effect of the surface field produced by the donors.

Fabrication of the laser is identical to that of the self-aligned FET. First the W emitter/gate 14 was deposited and patterned and then used as a mask to etch down to the top of the graded confinement layer. Then the n+ implant contacts 15 and 17 were formed by ion implantation of Si to a depth of about 2000 A. Rapid thermal annealing was done at 950 degrees C. for 10 secs. A mesa was etched down to the p+GaAs layer 1 to make collector contact and another wet etch down to the substrate isolates the total device. Au/Zn contacts 19 were made to the collector and AuGe/Ni contacts 21 to the source by lift-off. Lasers were formed by thinning and cleaving. Although the implants 15 and 17 were formed on both sides of the gate for symmetrical waveguiding, only the source was accessed electrically.

The finished device cross-section is shown in FIG. 1. It is noted that the FET structure naturally produces a ridge waveguide laser such that the active region 5 is at no point exposed. The ion-implants are masked by the refractory gate and thus the implants are self-aligned to the gate as is well understood by the skilled worker in the art. Thus the inside portions of implants 15 and 17 will extend slightly into the semiconductor portion 6 as shown. However, the term "self-aligned" is intended to include an equivalent substantial extension of the implants into portion 6, much greater than as shown; however they should not touch each other. The isolation by self-aligned implantation produces a natural index change for optimal guiding at the quantum well due to the index change from the increased doping and due to the disordering produced in the quantum well by the implant. Thus the implants 15 and 17 are multi-purpose serving as injector and providing both electrical and optical confinement. Also because a pn junction is formed at portions 8, surface leakage currents are suppressed.

It is noted that the HFET laser is a three terminal laser since both the collector and the gate (emitter) are available to inject holes into the quantum well. However, the collector whose primary role is to adjust the threshold voltage of the FET is best suited to turn the channel and hence the laser one and off. Hence the potential exists to control the low impedance state of the laser by field effect from a high impedance node. While it is believed that 1-4 quantum wells will produce satisfactory results, tests on a laser device made in accordance with the invention indicates that three quantum wells are preferred at present. The spacer layer 13 is not too critical, as the laser would work without it, but not as well. While both n+ implants 15 and 17 are required to practice the present invention, only one implant need have a source electrode as shown. The implant 17 could however also have a source electrode within the scope of the invention.

Figure 2A:
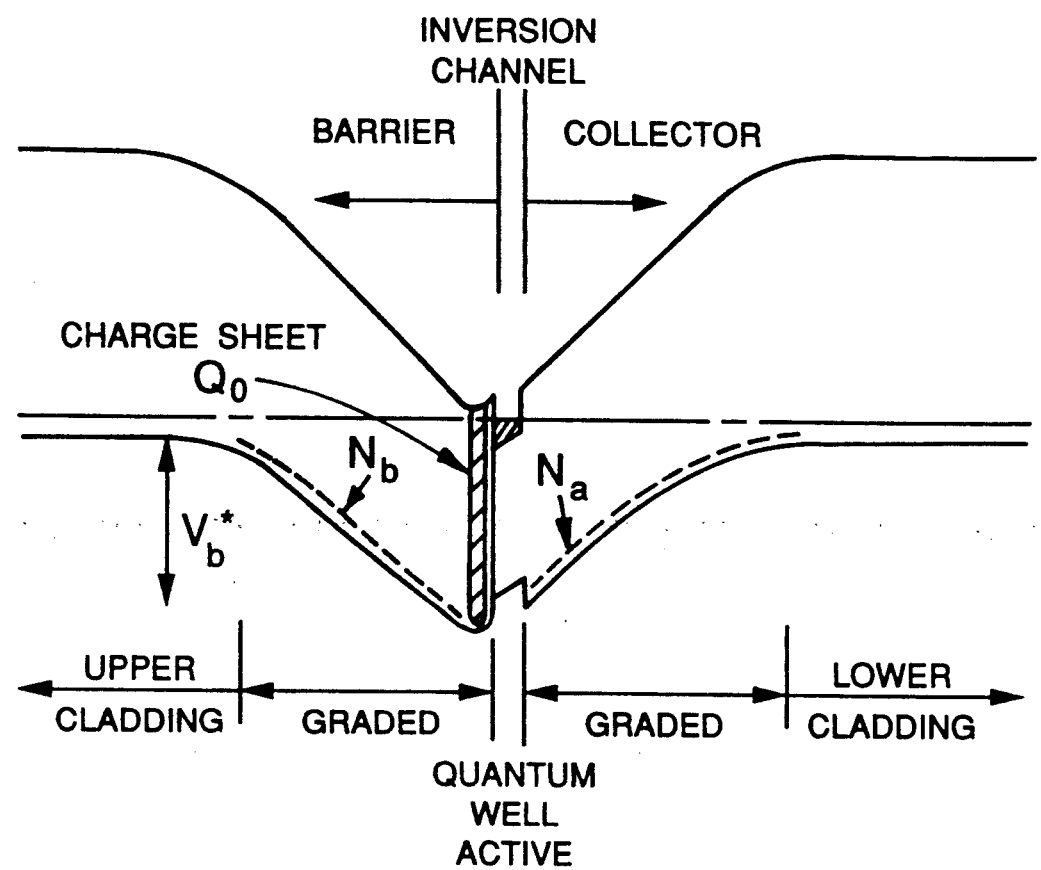
FIG. 2(a)-2(b) illustrates the energy band cross-section through the gate of the HFET laser. The nomenclature on the top indicates the FET terminology and that on the bottom the laser terminology.
Figure 2B:
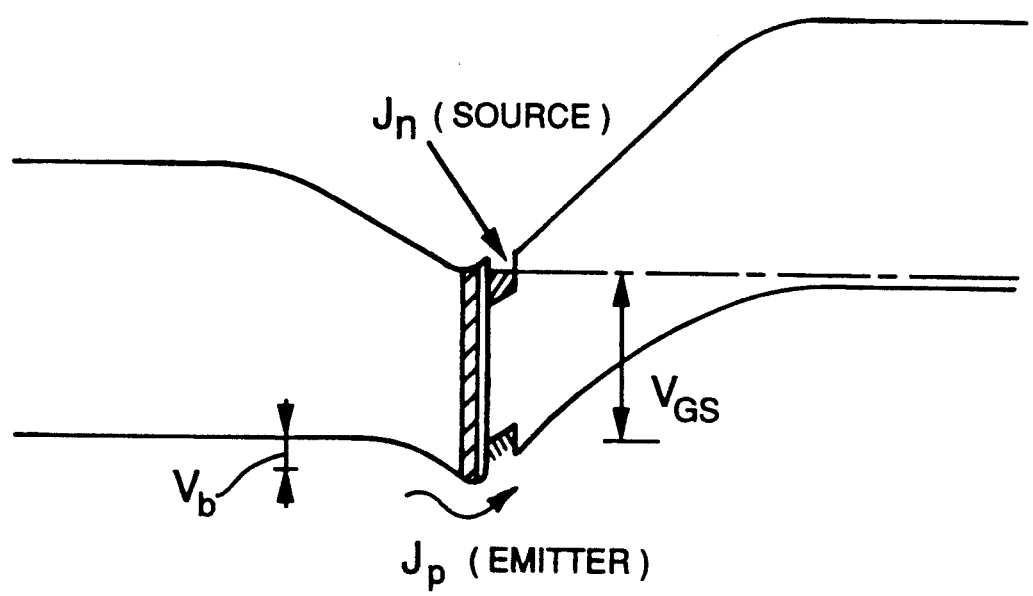

The energy diagrams through the gate both in the unbiased and lasing conditions are shown in FIGS. 2(a), and 2(b). The equilibrium state of the device is determined by the FET threshold and may be enhancement (no charge in the channel) or depletion with inversion charge as shown in FIG. 2(b). The threshold voltage of the FET is determined by the doping parameters Nb (barrier doping), Na (collector doping) and Qo (sheet charge) and for the growth sequence here a depletion device is obtained (v=4 V). The normal region of operation of the FET is with gate voltages below the onset of gate conduction of holes over the barrier. The normal region of operation for the laser is with the gate voltage above this conducting value as shown in FIG. 2(b). Thus the gate injects holes into the quantum well body in the vertical direction and implant 15 is biased to inject electrons into the channel. The electron current is a field-effect current and flows when the gate-emitter voltage exceeds the FET threshold voltage.

Figure 3:
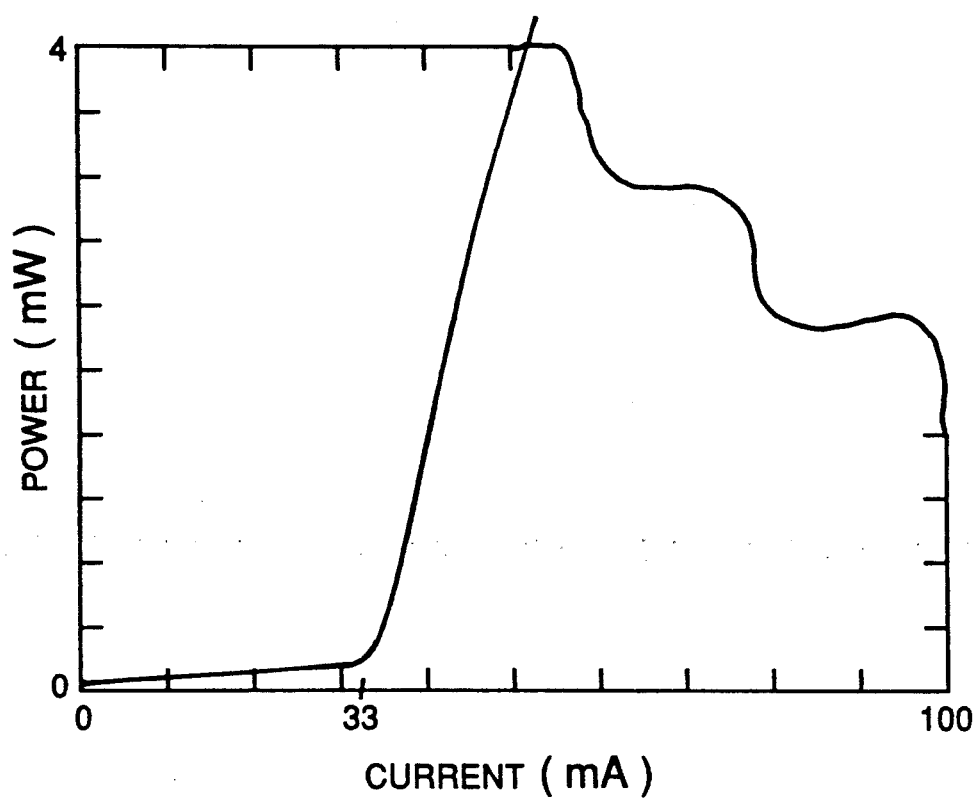
FIG. 3 shows an L-I curve for the HFET laser using a 10 micron strip and a single facet.

FIG. 3 shows the light output versus current curve at room temperature under pulsed conditions. The measured threshold currents were 75 mA, 42 mA and 33 mA for stripe widths of 20 microns, 15 microns and 10 microns respectively. The corresponding threshold current densities in these cases with a laser length of 500 microns were 750 A/cm$^2$, 560 Acm$^2$ and 640 A/cm$^2$ respectively. The differential quantum efficiencies were 26%, 47% and 56% respectively. From these results it is inferred that in the 20 micron device some current crowding occurs but that in the 10 micron device the channel resistance is low enough that the injection is uniform over the channel. The resistance of the 10 micron channel device was 10 ohms as determined from the source emitter input characteristic as shown in the insert in FIG. 3. It is estimated that the channel accounts for only 2 ohms and thus the current flow at threshold would result in about fifty millivolts of voltage drop in the channel at room temperature, which implies near uniform injection. Clearly the injection would become more and more uniform as the channel length (stripe width is reduced). This would also benefit the speed of the laser which electrically is identical to the speed of the FET. It is therefore transit time limited for channel lengths of 1–2 microns and less. In fact the incentive to realize submicron FETs for high speed electronic gates applies equally to the laser and with sufficiently small feature sizes will approach a quantum wire laser in the limit.

Figure 4:
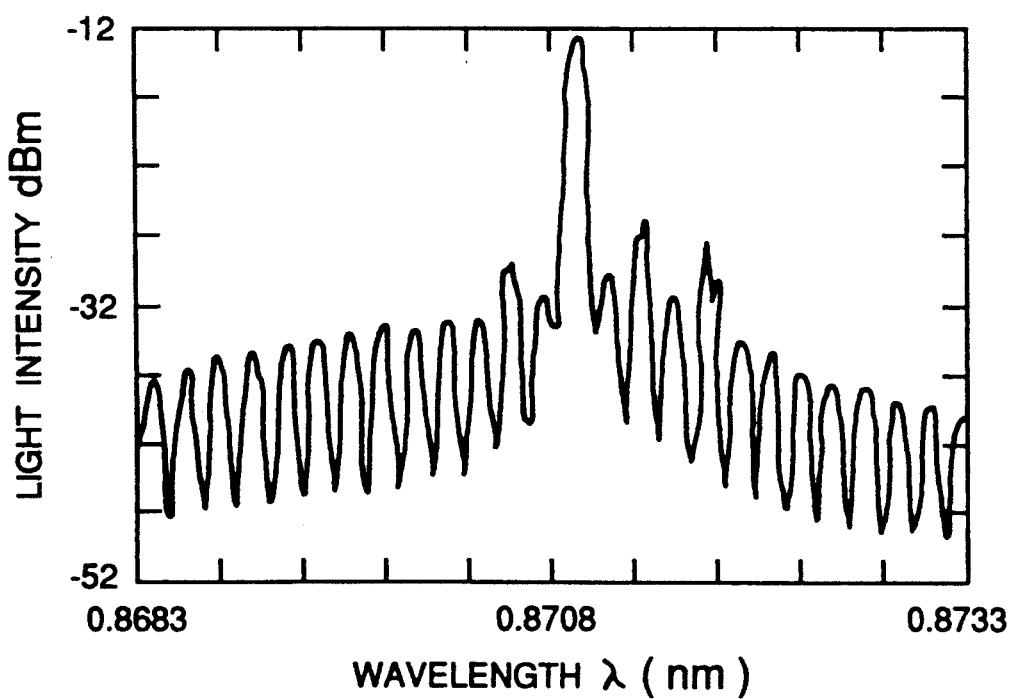
FIG. 4 shows the spectral response of the 10 micron HFET Laser.

The lasing wavelength of the devices was 870 nm for the 10 micron device as shown by the spectra in FIG. 4. The 20 micron channel showed two dominant longitudinal modes. We suspect this bimodel spectra is due to the nonuniform current injection across the stripe. The 10 micron device shows a single longitudinal mode which becomes clear at an injection level of forty to fifty ma. threshold current.

The parameters of the HFET laser and the HFET have been optimized in this structure for the GaAs/AlGaAs system. The limitation for both modes of operation in this material system is the parasitic series resistance associated with the implanted junction. For reasonable confinement of the energy levels in the quantum well body, the Al content next to the well should be at least 20%. Also for efficient optical confinement, the GRIN structure should vary over about 2000 A to a high level of Al (say 50–70%). Therefore, the implanted junction will be formed in Al(20%–50%)GaAs for which low values of source resistance are very difficult to achieve. However, if the quantum well is strained InGaAs material, then all Al values may be reduced and hence low values of parasitic source resistance for both the laser and the FET may be achieved.

While there has been described what is at present considered to be the preferred embodiments of this invention, it will be obvious to those skilled in the art that various changes and modifications may be made therein without departing from the invention and it is, therefore, intended in the appended claims to cover all such changes and modifications as fall within the true spirit and scope of the invention, including art recognized equivalents.

What is claimed is:

1. A bipolar inversion channel field effect transistor laser comprising:
   (a) an active layer of a quantum well body formed within a central portion of said laser;
   (b) an upper cladding layer and a lower cladding layer positioned above and below the central portion of said laser respectively, for confining light vertically within the central portion of the laser;
   (c) a gate/emitter contact electrically coupled to the upper cladding layer;
   (d) a pair of n+ ion-implant wells, self-aligned with respect to the gate/emitter contact and intersecting the central portion of said laser for confining light laterally therein and configured to insure that said active layer is at no point exposed;
   (e) first electrode means co-acting with said ion-implant wells for pumping electrons into the active layer laterally and symmetrically; and
   (f) second electrode means including said gate/emitter contact and a collector contact electrically coupled to said lower cladding layer for pumping holes into the active region, thereby to produce lasing of said laser.

2. The laser of claim 1 including a charge sheet layer positioned adjacent said active layer.

3. The laser of claim 1 including a spacer layer positioned adjacent said active layer.

4. The laser of claim 2 including a spacer layer positioned adjacent said active layer.

5. The laser of claim 1 wherein said upper cladding layer comprises p+ AlGaAs, and said lower cladding layer comprises p AlGaAs.

6. The laser of claim 2 wherein said upper cladding layer comprises p+ AlGaAs, and said lower cladding layer comprises p AlGaAs.

7. The laser of claim 1 including an ohmic contact layer of p+ GaAs positioned between said gate/emitter contact and said upper cladding layer.

8. The laser of claim 5 including an ohmic contact layer of p+ GaAs positioned between said gate/emitter contact and said upper cladding layer.

9. The laser of claim 1 including a p+ GaAs substrate in contact with the lower cladding layer and the collector contact.

10. The laser of claim 2 wherein said charge sheet layer comprises n+ Al$_{.25}$ GaAs.

11. The laser of any one of claims 1 and 2-10 wherein said quantum well body has one to four wells therein.

12. The laser of any one of claims 1 and 2-10 wherein said quantum well body has three wells therein.

13. The laser of any one of claims 1 and 2-10 wherein the index of refraction of said upper and lower cladding layers is graded.

14. A bipolar inversion channel field effect transistor laser comprising:
   (a) an active layer of a quantum well body formed within a central portion of said laser;
   (b) an upper cladding layer and a lower cladding layer positioned above and below the central portion of said laser respectively, for confining light vertically within the central portion of the laser;
   (c) a gate/emitter contact electrically coupled to the upper cladding layer;
   (d) a pair of n+ ion-implant wells intersecting the central portion of said laser for confining light laterally therein and configured to insure that said active layer is at no point exposed;
   (e) first electrode means co-acting with said ion-implant wells for pumping electrons into the active layer laterally and symmetrically; and
   (f) second electrode means including said gate/emitter contact and a collector contact for pumping holes into the active region, thereby to produce lasing of said laser.

15. The laser of claim 14 including a spacer layer positioned between a quantum well body and said charge sheet layer.

16. The laser of claim 14 wherein said upper cladding layer comprises p+ AlGaAs, and said lower cladding layer comprises p AlGaAs.

17. The laser of claim 15 wherein said upper cladding layer comprises p+ AlGaAs, and said lower cladding layer comprises p AlGaAs.

18. The laser of claim 14 including an ohmic contact layer of p+ GaAs positioned between said gate/emitter contact and said upper cladding layer.

19. The laser of claim 15 including an ohmic contact layer of p+ GaAs positioned between said gate/emitter contact and said upper cladding layer.

20. The laser of claim 14 including a p+ GaAs substrate in contact with the lower cladding layer and the collector contact.

21. The laser of claim 15 wherein said charge sheet layer includes n+ Al$_{.25}$ GaAs.

22. The laser of any one of claims 14 and 15-21 wherein said quantum well body has one to four wells therein.

23. The laser of any one of claims 14, 15, and 16 wherein said quantum well body has three wells therein.

24. The laser of any one of claims 14, 15 and 16 wherein the index of refraction of said upper and lower cladding layers are graded.

* * * * *